United States Patent
Anzures et al.

(10) Patent No.: US 6,900,003 B2
(45) Date of Patent: May 31, 2005

(54) PHOTORESIST PROCESSING AID AND METHOD

(75) Inventors: Edgardo Anzures, Westborough, MA (US); Daniel E. Lundy, Winchendon, MA (US); Robert K. Barr, Shrewsbury, MA (US); Corey O'Connor, Worcester, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/408,414

(22) Filed: Apr. 7, 2003

(65) Prior Publication Data

US 2004/0018453 A1 Jan. 29, 2004

Related U.S. Application Data

(60) Provisional application No. 60/371,986, filed on Apr. 12, 2002.

(51) Int. Cl.$^7$ ................................................ G03F 7/32
(52) U.S. Cl. ....................................... 430/331; 510/466
(58) Field of Search ........................... 430/331; 510/466

(56) References Cited

U.S. PATENT DOCUMENTS

| | | | |
|---|---|---|---|
| 3,248,335 A | 4/1966 | Teot et al. ................... 510/495 |
| 3,264,242 A | 8/1966 | Teot et al. .............. 106/287.19 |
| 3,634,272 A | 1/1972 | Valenta et al. ............... 510/427 |
| 3,945,437 A | 3/1976 | Chiu et al. ............... 166/305 R |
| 4,013,569 A | 3/1977 | Chiu et al. ............. 252/8.55 D |
| 4,075,411 A | 2/1978 | Dickstein ..................... 560/224 |
| 4,180,472 A | 12/1979 | Mitchell et al. ............. 252/162 |
| 4,343,718 A | 8/1982 | Williams ..................... 252/352 |
| 4,532,051 A | 7/1985 | Nuckels nee Byth et al. ....................... 252/8.55 D |
| 4,565,776 A | 1/1986 | Kim et al. ................... 430/467 |
| 4,645,623 A | 2/1987 | Dolan et al. ................. 510/428 |
| 4,687,593 A | 8/1987 | Dolan et al. ............ 252/182.31 |
| 4,759,867 A | 7/1988 | Choy et al. .................. 510/384 |
| 4,820,429 A | 4/1989 | Lim ............................ 507/202 |
| 4,820,621 A | 4/1989 | Tanka et al. ................. 430/331 |
| 5,049,481 A | 9/1991 | Okamoto et al. ......... 430/283.1 |
| 5,132,038 A | 7/1992 | Kukanskis et al. ......... 510/175 |
| 5,171,459 A | 12/1992 | Kaplan ........................ 507/236 |
| 5,273,677 A | 12/1993 | Arif ............................ 510/514 |
| 5,278,030 A | 1/1994 | Ingham et al. ............... 430/331 |
| 5,360,457 A | 11/1994 | Ruggiero et al. ............... 8/567 |
| 5,451,238 A | 9/1995 | Ruggiero et al. ............... 8/567 |
| 5,543,268 A * | 8/1996 | Tanaka et al. ............... 430/331 |
| 5,575,958 A | 11/1996 | Jollenbeck et al. .......... 252/589 |
| 5,859,121 A | 1/1999 | Brandriff ..................... 524/505 |
| 5,906,962 A | 5/1999 | Pallas et al. ................. 504/361 |
| 5,922,522 A | 7/1999 | Barr et al. ................... 430/493 |
| 5,985,525 A * | 11/1999 | Sato et al. ................... 430/331 |
| 6,017,872 A | 1/2000 | Pedersen et al. ............. 510/424 |
| 6,063,550 A | 5/2000 | Lundy et al. ................ 430/331 |
| 6,200,736 B1 | 3/2001 | Tan ............................ 430/319 |
| 6,232,280 B1 | 5/2001 | Shah et al. .................. 510/179 |
| 6,248,506 B1 | 6/2001 | Lundy et al. ................ 430/329 |
| 6,274,648 B1 | 8/2001 | Meguriya et al. ............ 523/218 |
| 6,365,330 B1 * | 4/2002 | Leichsenring et al. ....... 430/331 |
| 2001/0014431 A1 * | 8/2001 | Nitta et al. .................. 430/326 |
| 2003/0215754 A1 * | 11/2003 | Lundy et al. ................ 430/325 |

OTHER PUBLICATIONS

Abstracts of JP 04174850, Jun. 23, 1992.*

* cited by examiner

*Primary Examiner*—Hoa Van Le
(74) *Attorney, Agent, or Firm*—John J. Piskorski

(57) ABSTRACT

A composition and method to reduce photolithographic residue and scum formation on a substrate or in a solution, and to reduce or prevent foam formation. The composition contains a diphenyl oxide compound in combination with an antifoam agent. The composition may be added to developer solutions and stripper solutions used in manufacturing printed wiring boards.

11 Claims, No Drawings

PHOTORESIST PROCESSING AID AND METHOD

This application claims the benefit of Provisional Application No. 60/371,986, filed Apr. 12, 2002.

BACKGROUND OF THE INVENTION

The present invention is directed to a composition and method for reducing residue and scum formation originating from photolithographic compositions as well as reducing foam formation. More specifically, the present invention is directed to a composition and method for reducing residue and scum formation originating from photolithographic compositions and for reducing foaming with a diphenyl oxide compound in combination with an antifoam agent.

Residue and scum from photolithographic compositions such as photoresists, surfactants, alkaline compounds and antifoam agents from developer and stripping compositions present difficult cleaning problems for the electronics industry. Such residue and scum can build-up on various products and apparatus. Photoresist materials are employed in the manufacturing of semiconductor devices, and electronic components such as integrated circuits, photomasks for the manufacture of integrated circuits, printed wiring boards and the like as well as planographic printing plates. In photolithographic processing, a step in the process of making electronic devices and components, a substrate surface is coated with a photoresist, i.e., a coating composition that is sensitive to actinic radiation, e.g., ultraviolet light, X-rays, electron beams and the like, to give a layer that is sensitive to actinic radiation which is irradiated pattern-wise with the actinic radiation. The irradiated photoresist is then developed with a developer solution to form a patterned photoresist layer that serves to selectively protect the substrate surface from etching, plating or diffusion of dopants.

Photoresists may be positive-working, or negative-working. Such photoresists may be liquid, or dry film. A photoresist composition of the positive-working type has such a photosensitivity that solubility of the composition in the developer solution is increased by exposure to light so that the patterned photoresist layer is formed on the areas unexposed to ultraviolet light where the composition is left undissolved. A negative-working photoresist composition exhibits behavior of a sensitivity and solubility that is the reverse of the positive-working photoresist.

Along with recent progress in the technology of semiconductor devices with a requirement for finer and finer high-fidelity patterning of a line width of 1 micron or even finer to comply with the trend of increased density of integration in semiconductor devices, photolithographic processes of patterning using a positive-working photoresist also envisages a difficult problem. When patterning is desired of an extremely fine contact hole in a fine pattern, alkaline developer solution is admixed with a surface active agent with an object to increase the wettability of the substrate surface with the aqueous developer solution. One of the problems in the addition of a surface active agent to the developer solution is that film residues and scums sometimes occur on the exposed areas where the photoresist layer desirably is dissolved away completely and cleanly. Although the film residues and scums can be removed by gently treating the surface with oxygen plasma or sputtering, no complete solution of the problem can be obtained by such methods because such treatments must be performed under well controlled troublesome conditions and is not efficient in respect of smooth removal of the scums, or gives no uniform effect of treatment in finely patterned areas having contact holes of about 1 micron or smaller in diameter.

U.S. Pat. No. 4,820,621 to Tanaka et al. has addressed the problem of residue and scum formation by modifying a developer solution with the addition of a non-ionic surface active agent that is a polyoxyethylene alkyl-substituted phenyl ether. The ether is included in the developer solution in an amount of from 50 to 5000 ppm (parts per million). The developer solution is employed in patterning using a positive-working photoresist composition composed of an alkali-soluble novolac resin and a naphthoquinone diazide compound. The '621 patent alleges that patterning the positive photoresist with the developer containing the polyoxyethylene alkyl-substituted phenyl ether prevents formation of residues and scums after development.

Similar residue and scum formation also occur when negative-working photoresists are employed. For example, in manufacturing printed circuit boards UV curable negative-working photoresists may be used. Exposed portions of the photoresist become insoluble in alkaline developer solution and form a protective barrier to other processing chemicals such as etching and plating solutions. Unexposed portions of the photoresist are to rinse freely from the circuit board with an alkaline solution such as a 1% sodium carbonate, monohydrate in water. Development occurs because polymers in the photoresist contain acid functionality. Such acid functionality within the polymers are neutralized in alkaline solution forming a water soluble organic salt. As the dissolved photoresist builds up in solution (developer loading), insoluble organic materials begin to form in the developing tank eventually forming a water insoluble residue or scum. Presence of anti-foam additives (conventionally added to developing solutions to minimize foaming) greatly increases the tendency for residue and scum to form. As the level of scum builds, chances increase for an inadvertent redeposit of these water insoluble residues onto the developed circuit board. Such redeposited residues cause a retardation of the etching solution (etching chemistries have difficulty penetrating any organic residues). Where etch is retarded, circuit shorts form causing a defective circuit board. In addition to increasing the potential for defective circuit boards, the residue also makes cleaning equipment difficult, thus increasing maintenance time.

In addition to the problem of built-up residue and scum formation from primary photoresists, there also is a residue and scum build-up problem from secondary photoresists. Such secondary photoresists may be employed in soldermasks. Residue and scum are deposited on a substrate as a result of component separation in the soldermask. Such component separation may be exacerbated when an improperly balanced soldermask developer solution, i.e., improper developing conditions and/or soldermask developer solution chemistry, contact the soldermask. Built-up residue and scum from secondary photoresists often appear as a bright green coating on a substrate such as a developer apparatus.

Conventional cleaners used to remove residue and scum may vary in composition. Typically, such conventional cleaners include as active ingredients a strong base such as sodium hydroxide, and chelating agents such as ethylene diamine tetraacetate (EDTA). Surfactants, solvents and emulsifying agents may also be included in the cleaners. Conventional cleaners are employed at temperature ranges from about 45° C. to about 55° C. Such conventional cleaners are primarily used because of the low cost of their ingredients. However, workers in the field using such conventional cleaners have discovered that the residue problem is often made worse. Often the equipment has to be manually cleaned to remove the residue from the photoresist as well as the conventional cleaners. Such manual cleaning is both a labor and time intensive operation that can cause a significant loss of production time. Further, as mentioned above, such cleaners are not effective enough for removing residue from new generation photoresists that have many hydrophobic aromatic materials. Accordingly, it is advantageous to reduce or prevent the build-up of such residue and scum to prevent or at least reduce the amount of cleaning.

U.S. Pat. No. 5,922,522 to Barr et al.; U.S. Pat. No. 6,063,550 to Lundy et al.; and U.S. Pat. No. 6,248,506 B1 to Lundy et al. disclose surfactant and surfactant mixtures included in developer solutions that prevent or inhibit the formation of residues and scum on circuit boards and circuit board manufacturing equipment. Such surfactants are composed of a hydrophobic group, an alkoxylated hydrophilic group and a nonionic or anionic capping group. Examples of suitable hydrophobic groups include nonylphenol, octylphenol and tristyrylphenol. Examples of suitable alkoxylated hydrophilic groups include ethylene oxide, propylene oxide and ethylene oxide/propylene oxide groups. Examples of suitable capping groups include hydroxyl, carboxyl, sulfonyl, phosphonyl, or mixtures thereof. Such residue and scum reducing compounds are included in developer solutions in amounts of from about 0.05% to about 1.0% by weight.

Although the developer solutions disclosed in U.S. Pat. Nos. 5,922,522; 6,063,550; and 6,248,506 B1 provide an effective means of reducing the amount of build-up of residue and scum on substrates containing photoresist, such as circuit boards, and equipment used in the manufacture of electronic components, there is still a need for a composition and method for further reducing the amount of residue and scum formation to reduce cleaning or to prevent cleaning. Additionally, there is also a need for a cleaning composition and method for further reducing foam formation in both developer and stripper solutions. While the above-mentioned patents address residue and scum formation in developer solutions, the patents do not address the problem of residue formation or foam formation in stripper solutions. Thus, there is a need for a composition that prevents residue formation and foaming in both developer and stripper solutions. Developers may be acid or basic solutions that remove un-cross-linked photoresist from a substrate after exposure of the photoresist to actinic radiation. Strippers are acidic or basic solutions that remove all photoresist from a substrate.

Photoresist that is removed by developer and stripper solutions can cause undesirable amounts of foaming. If the foaming is excessive, it can overflow from apparatus, and cause the solution levels to go down below a minimum threshold level that may result in equipment shutdown. Foaming can also obscure the field of view of workers making it difficult to determine photoresist break points, and to monitor panels in developing chambers. It is also more difficult to clean equipment that contains significant amounts of foam. Washing with water only aggravates the foaming problem In many cases, antifoaming agents are utilized in developing and stripping baths.

Many commercially available antifoams, however, can increase the amount of undesirable residue in developer and stripping solutions. The solutions can contain fairly high levels of organic material because the developed or stripped photoresist are emulsified and/or solubilized in the solution. An analysis of the residue from such photolithographic compositions reveals that it is a complex mixture of photoresist, antifoam, developer or stripper components. These residues can float on a developer or stripper solution surface and/or adhere to equipment parts. As mentioned above, presence of these residues can cause sub-optimum performance of the process equipment and surface contamination of the circuit boards. Both of these factors can result in printed wiring board defects. As a result, the key requirements for an antifoam in a developer or stripper are to control foaming in addition to minimizing the formation of residues from photolithographic compositions.

Accordingly, it is advantageous to have an antifoam product that effectively lessens the amount of foam while also reducing undesirable residues in photoresist developers. It is useful if the same antifoam product minimizes the foaming in photoresist strippers. Many antifoams are not suitable for both developers and strippers. Thus, there is a need for a composition that reduces or inhibits residue and scum deposited by photolithographic compositions, and reduces or inhibits foaming.

SUMMARY OF THE INVENTION

The present invention is directed to a residue reducing-antifoam composition containing a photolithographic composition residue cleaning component for reducing the amount of photolithographic residue on a substrate or in a solution and an antifoam agent, the residue reducing-antifoam composition contains a diphenyl oxide with at least one hydrophilic group in a sufficient amount to inhibit or reduce formation of photolithographic residues. The residue-reducing-antifoam composition of the present invention may be added to developer and stripper solutions to reduce or inhibit residue and scum formation caused by photolithographic compositions, and to reduce or inhibit foaming during developing and stripping processes.

Advantageously, the components of the composition do not aggravate residue and scum formation as many conventional cleaners. Antifoam agents employed in the cleaning composition reduce or inhibit foam formation during developing and stripping processes. Formation of residue and scum is difficult to prevent and once formed is difficult to emulsify and remove from a substrate or a solution. Continuous or prolonged use of equipment employed in developing and stripping photoresist, or that contacts photoresist during the manufacture of photolithographic devices such as printed wiring boards results in the build-up of undesirable residue and scum on the equipment. The residue and scum may block or clog lines or movable parts on the equipment resulting in production shutdown. Additionally, the residue build-up on printed wiring boards causes defects in the boards such as electrical shorts. Cleaning done with conventional cleaners is not always effective because residue and scum contain chemicals that are difficult to re-emulsify with conventional cleaners. Also, conventional cleaners may further contaminate the equipment and manufactured articles. Thus, prevention or at least reduction of residue and scum formation is highly desirable along with no or minimal cleaning. Advantageously, the compositions of the present invention are compatible with photolithographic equipment and do not aggravate residue and scum formation, but inhibit or reduce the formation of residue and scum.

Another problem is foaming. When photoresist is removed from a substrate with either a developer solution or a stripper solution, foaming may occur. As mentioned above, excessive foaming during photoresist removal may cause developer or stripper solution levels to go below their effective minimum threshold levels. Such a condition results in developer or stripper equipment shutdown. Foaming also may obscure a workers field of view during manufacturing of printed wiring boards making it difficult to determine photoresist break points, and to monitor printed wiring board panels in developing or stripping chambers. Additionally, cleaning equipment that contains large amounts of foam is difficult. Antifoam agents employed in the present invention prevent or reduce foam formation during developing and stripping procedures.

The combination of the diphenyl oxide and an antifoam agent reduce or inhibit residue and scum formation as well as reduce or inhibit foam formation during developing and stripping processes. Another advantage of the cleaning composition is that antifoam agents that are utilized are compatible with both developer and stripper solutions. Generally, antifoam agents are not suitable for use in both developer and stripper solutions. Strippers generally have higher electrolyte content and are at higher pH ranges than developers. Such conditions are not suitable for many antifoam agents. Thus the cleaning composition of the present invention solves at least two important problems in developing and stripping.

Accordingly, a primary objective of the present invention is to provide for an improved residue reducing-antifoam composition containing a diphenyl oxide with at least one hydrophilic group and an antifoam agent.

Another objective of the present invention is to provide for an improved residue reducing-antifoam composition that reduces or inhibits the formation of residue and scum from photolithographic compositions on a substrate and a solution.

A further objective of the present invention is to provide for a residue reducing-antifoam composition that reduces or inhibits foaming during developing and stripping procedures.

An additional objective of the present invention is to provide for an improved method of reducing residue and scum formation as well as foaming during developing and stripping procedures.

Other advantages may be ascertained by a person of skill in the art reading the following description of the invention and the appended claims.

DETAILED DESCRIPTION OF THE INVENTION

A residue reducing-antifoam composition of the present invention contains a diphenyl oxide with at least one hydrophilic group and an antifoam agent. The diphenyl oxide with at least one hydrophilic group is included in the composition in a sufficient amount such that residue formation from photolithographic compositions is reduced or inhibited from forming on a substrate or in a solution. Photolithographic residue includes primarily residue from photoresist but also includes scum and residue from developer and stripper compositions such as for some antifoams, surfactants and alkaline compounds used in developer and stripper solutions.

Diphenyl oxides within the scope of the present invention have the following formula:

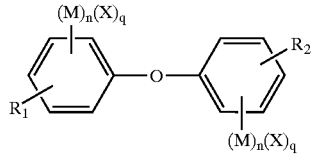

(I)

where M is $-COO^-$, $-SO_3^-$, $-SO_4^{2-}$, $-PO_4^{3-}$, $-PO_4(R')_2$, X is hydrogen or a counter ion $R_1$ and $R_2$ are the same or different and include, but are not limited to, hydrogen, an aliphatic, cycloaliphatic, or aromatic, R' is a hydrocarbon, n and q are 0 or 1 with the proviso that at least one of the two phenyl rings of the diphenyl oxide has n=1. When n=0, q also equals 0.

Examples of suitable aliphatic groups include, but are not limited to, linear or branched alkyl groups of from 1 to 25 carbon atoms, preferably from 5 to 10 carbon atoms. Illustrative aliphatic groups are methyl, ethyl, propyl, isopropyl, butyl, isobutyl, pentadecyl, hexadecyl, octadecyl and the like. Examples of suitable cycloaliphatic groups include, but are not limited to, cycloaliphatic groups having from 5 to 10 carbon atoms, preferably from 5 to 6 carbon atoms. Examples of hydrophobic aromatic groups include, but are not limited to, aromatic groups having from 5 to 14 carbons, preferably from 5 to 6 carbons.

Counter ion X includes, but is not limited to, sodium, potassium, calcium, magnesium, ammonium or an amine. X ammonium ion radicals are of the formula $(R'')_3NH^+$ wherein each R'' is independently hydrogen, a $C_1$–$C_4$ alkyl or a $C_1$–$C_4$ hydroxyalkyl radical. Illustrative $C_1$–$C_4$ alkyl and hydroxyalkyl radicals include methyl, ethyl, propyl, isopropyl, butyl, hydroxymethyl and hydroxyethyl. Typical ammonium ion radicals include ammonium ($N^+H_4$), methylammonium ($CH_3N^+H_3$), ethylammonium ($C_2H_5N^+H_3$), dimethylammonium (($CH_3)_2NH_2^+$), methylethylammonium ($CH_3N^+H_2C_2H_5$), trimethylammonium (($CH_3)_3N^+H_2$), dimethylbutylammonium (($CH_3)_2N^+HC_4H_9$), hydroxyethylammonium ($HOCH_2CH_2N^+H_3$) and methylhydroxyethylammonium ($CH_3N^+H_2\ CH_2CH_2OH$). Preferably, X is hydrogen, sodium, calcium, potassium or ammonium.

Preferably, M is $-SO_3^-$, $-PO_4^{3-}$, or $-PO_4(R')_2$ where R' is as defined above, and $R_1$ and $R_2$ are the same or different and are hydrogen or a 1 to 20 carbon aliphatic group, or a 5 to 6 hydrophobic aromatic group with the proviso that when one of $R_1$ or $R_2$ is hydrogen the other is the aliphatic or aromatic group. More preferably, M is $-PO_4^{3-}$ or $PO_4(R')_2$ and $R_1$ and $R_2$ are the same or different and are hydrogen or a 1 to 20 carbon aliphatic group with the proviso that when one of $R_1$ or $R_2$ is hydrogen the other is the aliphatic group. Most preferably, M is $-PO_4^{3-}$ and $R_1$ and $R_2$ are the same or different and are hydrogen or a 1 to 20 carbon aliphatic group with the proviso that when one of $R_1$ or $R_2$ is hydrogen the other is the aliphatic group.

Diphenyl oxides with at least one hydrophobic group may be prepared by any suitable method know in the art. Alkylated diphenyl oxides may be sulfonated with any suitable sulfonating agent, such as sulfur trioxide, mixtures of sulfur dioxide and sulfur trioxide, chlorosulfonic acid, and the like by conventional procedures. The resulting sulfonic acid can be neutralized with an alkali metal hydroxide or carbonate, such as sodium carbonate or potassium hydroxide, or by the use of any other suitable base conventionally employed in the preparation of ammonium or alkali metal salts or aryl sulfonic acids. Methods for preparing diphenyl oxide compounds with at least one hydrophobic group are disclosed in U.S. Pat. Nos. 3,248,335 and 4,687,593 the entire disclosures of which are hereby incorporated herein by reference. The disclosures of both patents provide sufficient information to a person of skill in the art to make any of the diphenyl oxide compounds of the present invention.

Diphenyl oxides within the scope of the present invention also may be obtained commercially. Commercially available solutions containing alkylated diphenyl oxide sulfonate surfactants are DOWFAX® C10L, DOWFAX® 8390 and DOWFAX® 8390A. ("DOWFAX® is a registered trademark of The Dow chemical Company for its brand of these anionic surfactants.). The alkyl group $R_1$ and $R_2$ is predominantly a hexadecyl ($C_{16}$) group in the 8390 and 8390A composition. DOWFAX® 8390A contains about 25% of the acid form of the surfactant, that is, in which X is hydrogen. DOWFAX® 8390 contains about 35% of sodium salts of the surfactant, that is, in which X is sodium. DOWFAX® 8390A solution is fully or partially neutralized with ammonium hydroxide.

Antifoam agents used in combination with the diphenyl oxides include, but are not limited to, silicones including, but not limited to, polysiloxanes, petroleum hydrocarbons, acetylenics, vinyl polymers and polyalkoxylates. Such antifoam agents are highly suitable for reducing or inhibiting foam formation when combined with one or more diphenyl oxides when developing or stripping photoresist residue from a substrate.

Examples of suitable silicones include, but are not limited to, siloxanes such as polydimethyl siloxane (TP305 manufactured by OSI Specialties), polyalkylene oxide methyl siloxane and a mixture of polyglycol and siloxane. Also included are polysiloxane mixed with polyglycols.

The major class of compounds found to provide highly suitable cosurfactants with silicone compounds are water-soluble polyethylene glycols having a molecular weight of 150 to 1000, polypropylene glycol of the formula $HO(CH_3CHCH_2O)_pH$ wherein p is a number from 2 to 18, mixtures of polyethylene glycol and polypropylene glycol (Synalox®) and mono and di $C_1$–$C_6$ alkyl ethers and esters of ethylene glycol and propylene glycol having the structural formulas $R_3(Y)_rOH$, $R_4(Y)_rOH$, $R_3(Y)_rOR_3$ and $R_4(Y)_rOR_4$ wherein $R_3$ is $C_1$–$C_6$ alkyl group, $R_4$ is $C_2$–$C_4$ acyl group, Y is $(OCH_2CH_2)$ or $(OCH_2(CH_3)CH)$ and r is a number from 1 to 4, diethylene glycol, triethylene glycol, an alkyl lactate, wherein the alkyl group has 1 to 6 carbon atoms, 1 methoxy-2-propanol, 1 methoxy-3-propanol, and 1 methoxy 2-, 3- or 4-butanol.

Examples of suitable petroleum hydrocarbons include, but are not limited to, alkanes and alkenes that have a flash point not lower than about 65° C., preferably not lower than about 90° C. (Tag closed cup test), an initial boiling point not lower than about 130° C., and a solidification point not above about 20° C. In general, the preferred alkanes that meet these criteria will be aliphatic hydrocarbons having the generic formula $C_mH_{2m+2}$, in which m is from about 10 to about 18 (i.e., the aliphatic series decane through octadecane). Although single compounds are suitable for use in this invention, most commercially available solvents that meet the boiling point and distillation point criteria will be mixtures of aliphatic hydrocarbons. Examples of suitable commercially available materials are Paraffin F® (Exxon), Isopar® (Exxon), Varsol® (Exxon), Norpar® (Exxon), 95% dodecane, and kerosene, especially deodorized kerosene. Byks® which is a petroleum hydrocarbon obtainable by Byk-Chemie also may be employed.

Kerosene is a mixture of petroleum hydrocarbons comprising principally alkanes having from 10 to 16 carbon atoms per molecule. It constitutes the fifth fraction in the distillation of petroleum, being collected after the petroleum ethers and before the oils. Although kerosene is comprised mainly of alkanes, a typical kerosene also includes alkyl derivatives of benzene and naphthalene. Kerosene particularly suitable for use in this invention is deodorized and decolorized by washing with sulfuric acid followed by treatment with sodium plumbite solution and sulfur.

The use of alkanes containing substantial molecular species with carbon chain lengths over about 18 is undesirable because of a tendency to distribute poorly in aqueous medium. In general, any alkane/alkene mixture should be freely pourable at 20° C. In general, suitable alkanes will have a density at 20° C. less than about 0.8.

Examples of suitable acetylenics include, but are not limited to, compounds having the general formula $R_5$—C≡C—$R_6$ (II) where $R_5$ and $R_6$ are the same or different and are alkyl or aryl. Examples include, but are not limited to, $R_5$ and $R_6$ are $C_1$–$C_{10}$ alkyl. Commercially available acetylenics include SURFYNOLS® obtainable from Air Products.

Examples of suitable vinyl polymers include, but are not limited to, materials having C=C moieties and other useful copolymerizable monomer components for use in the present invention can be selected from a variety of unsaturated materials as illustrated in the following list. The material may be selected from the group consisting of acrylonitrile, methacrylonitrile, methyl acrylate, methyl methacrylate, vinyl acetate, vinyl methyl ketone, isopropenyl methyl ketone, acrylic acid, methacrylic acid, acrylamide, methacrylamide, n-amyl methacrylate, styrene, m-chlorostyrene, o-chlorostyrene, p-chlorostyrene, n-decyl methacrylate, N,N-diallylmelamine, N,N-di-n-butylacrylamide, di-n-butyl itaconate, di-n-butyl maleate, diethylaminoethyl methacrylate, diethyleneglycol monovinyl ether, diethyl fumarate, diethyl itaconate, diethyl vinylphosphonate, vinylphosphonic acid, diisobutyl maleate, diisopropyl itaconate, diisopropyl maleate, dimethyl fumarate, dimethyl itaconate, dimethyl maleate, di-n-nonyl fumarate, di-n-nonyl maleate, dioctyl fumarate, di-n-octyl itaconate, di-n-propyl itaconate, n-dodecyl vinyl ether, ethyl acid fumarate, ethyl acid maleate, ethyl acrylate, ethyl cinnamate, N-ethylmethacrylamide, ethyl methacrylate, ethyl vinyl ether, 5-ethyl-2-vinylpyridine, 5-ethyl-2-vinylpyridine 1-oxide, glycidyl acrylate, glycidyl methacrylate, n-hexyl methacrylate, 2-hydroxyethyl methacrylate, 2-hydroxypropyl methacrylate, isobutyl methacrylate, isobutyl vinyl ether, isoprene, isopropyl methacrylate, isopropyl vinyl ether, itaconic acid, lauryl methacrylate, methacrylamide, methacrylic acid, methacrylonitrile, N-methylolacrylamide, N-methylolmethacrylamide, N-alkoxymethylacrylamide, N-alkoxymethylmethaerylamide, N-butoxymethylmethacrylamide, N-vinyl-caprolactam, methyl acrylate, N-methylmethacrylamide, m-methylstyrene, o-methylstyrene, p-methylstyrene, 2-methyl-5-vinylpyridine, n-propyl methacrylate, sodium p-styrene sulfonate, stearyl methacrylate, styrene, p-styrene sulfonic acid, p-styrenesulfonamide, vinyl bromide, 9-vinylcarbazole, vinyl chloride, vinylidene chloride, 1-vinylnaphthalene, 2-vinylnaphthalene, 2-vinylpyridine, 4-vinylpyridine, 2-vinylpyridine N-oxide, 4-vinylpyrimidine, and N-vinylpyrrolidone. Mixtures of these materials may also be employed.

Polyalkoxylates such as the Pluronics® and Tetronics® from BASF may be employed as antifoams in the present invention. Examples of suitable polyalkoxylates include, but are not limited to, nonionic surfactants such as block copolymers of polyoxypropylene-polyoxyethylene or ethylene oxide and propylene oxide adducts of fatty alcohols such as poly(oxyalkylated) alcohols which are represented by the formula:

$$R_7O\text{—}(PO)_x\text{-}(EO)_y\text{—}(PO)_z\text{—}H \tag{III}$$

wherein $R_7$ is a linear, alkyl hydrocarbon having an average of from about 7 to about 10 carbon atoms;

PO stands for propylene oxide groups

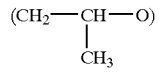

and

EO stands for ethylene oxide groups $(CH_2\text{—}CH_2\text{—}O)$;

x is an integer having a value from 1 to 6;

y is an integer having a value from 4 to 15; and z is an integer having a value from 4 to 25.

In addition to the diphenyl oxides described above, the cleaning composition may optionally contain auxiliary surfactants and a solvent to assist in removing photoresist residue. Examples of such auxiliary surfactants include, but are not limited to, quaternary ammonium salts, water soluble or water dispersable polymers other than the polymers described above, or surfactants having the following general formula:

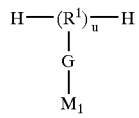

where $R^1$ is a ($C_1$ to $C_6$) alky or ($C_6$ to $C_{14}$) aryl group, G is a carboxyl, sulfonyl, or phosphonyl, $M_1$ is a charge-balancing cation such as sodium, potassium, or ammonium, and u is an integer of from 1 to 200, preferably an integer of from 2 to 200. When u is an integer of 2 or greater, G may be the same or different. An example of such surfactants is Newkalgen® TX-C (obtainable from Takemoto Oil and Fat Co.) which is a phenolic sulfonyl salt. Other suitable auxiliary surfactants include, but are not limited to, amine alkoxylates, fatty alcohol alkoxylates, fatty sorbitan esters and their alkoxylates, amphoteric surfactants, and the like.

Residue reducing-antifoam compositions of the present invention reduce or inhibit residue and scum formation from photolithographic compositions as well as reducing or inhibiting foaming during developing and stripping processes in the manufacture of printed wiring boards. Diphenyl oxides of the present invention may be employed in amounts of from about 20% by weight to about 95% by weight of the cleaning composition. Preferably, diphenyl oxides are employed at concentration ranges of from about 50% by weight to about 85% by weight of the cleaning composition. Antifoam agents are employed from about 5% by weight to about 80% by weight of the cleaning composition. Preferably, antifoam agents are employed from about 10% by weight to about 50% by weight of the cleaning composition. Auxiliary surfactants may be employed in amounts of up to about 75% by weight of the composition. Optionally, the balance of the cleaning composition may be solvent. Water is a preferred solvent, however organic solvents such as alcohols and ketones and the like also may be employed.

Any suitable organic solvent may be employed. A preferred residue reducing-antifoam composition of the present invention consists essentially of a diphenyl oxide, an auxiliary surfactant, an antifoam agent and a solvent. A most preferred residue reducing-antifoam composition consists of a diphenyl oxide and an antifoam agent.

Surprisingly, the compositions of the present invention prevent residue and scum formation from photolithographic compositions from both positive-working (both liquid and dry film) and negative-working photoresist (both liquid and dry film). Built-up residue and scum on a substrate or in solutions are difficult to remove with conventional cleaners because of the types of chemicals used in photoresists, in particular the new generation of photoresists which contain many compounds of a hydrophobic aromatic character. Thus, the compositions of the present invention prevent or reduce the amount of cleaning after processing printed wiring boards.

Additionally, the compositions of the present invention prevent residue and scum formation deposited by secondary photoresists. Such photoresist may be employed in soldermasks. Residue and scum are deposited on a substate as a result of component separation in the soldermask. Such component separation may be exacerbated when an improperly balanced soldermask developer solution, i.e. improper developing conditions and/or soldermask developer solution chemistry, contact the soldermask. Residue and scum build-up on such substrates as printed wiring boards and soldermask developer apparatus. Built-up residue and scum may appear as a bright green coating on developer apparatus surfaces. The bright green coating comes from an oily layer of water insoluble material from the secondary photoresist in which pigment from the photoresist concentrates. Generally, there is a higher level of hydrophobic aromatic compounds in secondary photoresist formulations than primary photoresist formulations.

Residues and scum from photoresist include, but are not limited to, such chemical materials as hydrophobic aromatic materials such as photoinitiators, thermoinitiators, dyes, acrylic, and methacrylic monomers. Photoinitiators such as photoacid generators, photobase generators or free-radical generators once built-up as residue or scum on a substrate are more difficult to remove than many of the other components that compose the residue and scum. Such materials do not readily re-emulsify once they build-up on a substrate such as photolithographic manufacturing apparatus.

Photoresists vary in composition. Generally, a photoresist composition may compose from about 20% to about 90% by weight of a binder polymer, about 15% to about 50% by weight of α,β-ethylenically unsaturated compounds (cross-linkers) such as monomers and short-chain oligomers and from about 0.1% to about 25% by weight of a photoinitiator or photoinitiator chemical system. Liquid photoresists may contain a larger concentration of binder in relation to monomers or short-chain oligomers whereas dry film may contain larger concentrations of monomers or short-chain oligomers. Such concentrations are known in the art. Other components employed in a photoresist that may contribute to residue and scum build-up are discussed below. Built-up residue and scum from liquid photoresist appears as crystalline material on a substrate. Such built-up residue and scum may be removed with cleaning compositions containing a cleaning compound of formula I in a concentration range of from about 0.1% by weight to about 35% by weight, preferably from about 0.2% by weight to about 0.8% by weight of the cleaning composition or cleaning bath. Built-up residue from dry film as well as secondary photoresists may be removed from a substrate at concentrations of a compound of formula I of from greater than 1.0% by weight to about 35% by weight of the cleaning composition or bath. Preferably, a compound of formula I may be employed at a concentration of from about 2% to about 8% by weight of the cleaning composition to remove built-up residue and scum generated from dry film or secondary photoresists.

Examples of components that compose a photoresist that may cause undesirable built-up residue or scum on a substrate include, but are not limited to, polymeric binders such as those containing as polymerized units one or more ethylenically or acetylenically unsaturated monomers. Examples of monomers include, but are not limited to: (meth)acrylic acid, (meth)acrylamides, alkyl (meth) acrylates, alkenyl (meth)acrylates, aromatic (meth)acrylates, vinyl aromatic monomers, nitrogen-containing compounds and their thio-analogs, substituted ethylene monomers, cyclic olefins, substituted cyclic olefins, and the like. Preferred monomers include (meth)acrylic acid, alkyl (meth) acrylates and vinyl aromatic monomers. Such polymeric binders may be homopolymers or copolymers and preferably copolymers.

Cross-linkers that may cause residue or scum build-up include di-, tri-, tetra-, or higher multi-functional ethylenically unsaturated monomers. Examples of such cross-linkers include, but are not limited to: trivinylbenzene, divinyltoluene, divinylpyridine, divinylnaphthalene and divinylxylene; and such as ethyleneglycol diacrylate, trimethylolpropane triacrylate ("TMPTA"), diethyleneglycol divinyl ether, trivinylcyclohexane, allyl methacrylate ("ALMA"), ethyleneglycol dimethacrylate ("EGDMA"), diethyleneglycol dimethacrylate ("DEGDMA"), propyleneglycol dimethacrylate, propyleneglycol diacrylate, trimethylolpropane trimethacrylate ("TMPTMA"), divinyl benzene ("DVB"), glycidyl methacrylate, 2,2-dimethylpropane 1,3 diacrylate, 1,3-butylene glycol diacrylate, 1,3-butylene glycol dimethacrylate, 1,4-butanediol diacrylate, diethylene glycol diacrylate, diethylene glycol dimethacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol 200 diacrylate, tetraethylene glycol dimethacrylate, polyethylene glycol dimethacrylate, ethoxylated bisphenol A diacrylate, ethoxylated bisphenol A dimethacrylate, polyethylene glycol 600 dimethacrylate, poly(butanediol) diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, ethoxylated diacrylates, ethoxylated triacrylates such as ethoxylated TMPTA and ethoxylated TMPTMA, ethoxylated tetraacrylates, divinyl silane, trivinyl silane, dimethyl divinyl silane, divinyl methyl silane, methyl trivinyl silane, diphenyl divinyl silane, divinyl phenyl silane, trivinyl phenyl silane, divinyl methyl phenyl silane, tetravinyl silane, dimethyl vinyl disiloxane, poly(methyl vinyl siloxane), poly(vinyl hydro siloxane), poly (phenyl vinyl siloxane), glycosyl ureas including di-, tri- and tetra-glycosyl ureas, epoxies and mixtures thereof. Such cross-linking agents are generally commercially available.

Photoimageable compositions contain one or more photoactive components. The photoactive components may be photoacid generators, photobase generators or free-radical generators. Such photoactive components are a major source of scum formations.

Example of photoacid generators include halogenated triazines, onium salts, sulfonated esters, halogenated sulfonyloxy dicarboximides, diazodisulfones, α-cyanooxyaminesulfonates, imidesulfonates, ketodiazosulfones, sulfonyldiazoesters, 1,2-di(arylsulfonyl)hydrazines and the like.

Free-radical generators include, but are not limited to, n-phenylglycine, aromatic ketones such as benzophenone, N,N'-tetramethyl-4, 4'-diaminobenzophenone [Michler's ketone], N,N'-tetraethyl-4,4'-diaminobenzophenone, 4-methoxy-4'-dimethylaminobenzophenone, 3,3'-dimethyl-4-methoxybenzophenone, p,p'-bis(dimethylamino) benzophenone, p,p'-bis(diethylamino)-benzophenone, anthraquinone, 2-ethylanthraquinone, naphthaquinone and phenanthraquinone, benzoins such as benzoin, benzoinmethylether, benzoinethylether, benzoinisopropylether, benzoin-n-butylether, benzoin-phenylether, methylbenzoin and ethybenzoin, benzyl derivatives such as dibenzyl, benzyldiphenyldisulfide and benzyldimethylketal, acridine derivatives such as 9-phenylacridine and 1,7-bis(9-acridinyl)heptane, thioxanthones such as 2-chlorothioxanthone, 2-methylthioxanthone, 2,4-diethylthioxanthone, 2,4-dimethylthioxanthone and 2-isopropylthioxanthone, acetophenones such as 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone, 2,4,5-triarylimidazole dimers such as 2-(o-chlorophenyl)-4,5-diphenylimidazole dimer, 2-(o-chlorophenyl)-4,5-di(m-methoxyphenyl) imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimer, and the like. Though, not a free-radical generator, triphenylphosphine may be included in the photoactive chemical system as a catalyst.

Optional additives that may be used in photoimageable compositions and that cause residue and scum include, but are not limited to: anti-striation agents, plasticizers, speed enhancers, fillers, dyes, film forming agents, non-polymerizable organic acids and the like. Suitable plasticizers include esters such as dibenzoate esters. Non-polymerizable organic acids may also be added to photoresist compositions. Such organic acids are substantially non-polymerizable with the polymeric binders, optional cross-linking agents or both. A wide variety of organic acids may suitably be added to photoresist compositions. Suitable organic acids include, but are not limited to, alkanecarboxylic acids and arylcarboxylic acids, sulfonic acids such as alkanesulfonic acids and arylsulfonic acids, phosphonic acids such as alkylphosphonic acids and arylphosphonic acids, and the like. Exemplary carboxylic acids include, but are not limited to, $(C_1-C_{12})$ alkylcarboxylic acids, $(C_1-C_{12})$alkyldicarboxylic acids, $(C_1-C_{12})$alkyltricarboxylic acids, substituted $(C_1-C_{12})$ alkylcarboxylic acids, substituted $(C_1-C_{12})$ alkyldicarboxylic acids, substituted $(C_1-C_{12})$ alkyltricarboxylic acids, amine carboxylic acids such as ethylenediamine tetraacetic acid, arylcarboxylic acids such as arylmonocarboxylic acids, aryldicarboxylic acids and aryltricarboxylic acids, and substituted arylcarboxylic acids. Preferred organic acids include formic acid, acetic acid, propionic acid, oxalic acid, malonic acid, succinic acid, glutaric acid, adipic acid, glycolic acid, lactic acid, tartaric acid, citric acid or malic acid, ethylenediamine tetraacetic acid, phthalic acid, benzene tricarboxylic acid, salicilic acid, cyclohexanecarboxylic acid, 1,4-cyclohexanedicarboxylic acid and sebacic acid.

A wide variety of photoresist strip enhancers also may be used in photoresists. Such strip enhancers may contribute to residue and scum build-up. Examples of photoresist strip enhancers are compounds containing one or more trihalomethyl-substituents in an alpha position relative to a group capable of stabilizing a negative charge.

Advantageously, the cleaning composition and method of the present invention provides for a method of inhibiting residue formation and foaming. The cleaning composition is highly effective for removing built-up organic residue and organic scum of photoresist from a substrate such as equipment used in manufacturing printed wiring boards. The cleaning composition and method may remove up to 98% by weight of undesirable built-up organic residue and scum from a substrate. The cleaning composition and method of the present invention eliminates the use of cleaners that may further aggravate contamination of equipment and printed wiring boards. The present invention provides for a more efficient manufacturing process since less time is involved in cleaning equipment, and less waste is generated thus providing for a more environmentally friendly cleaning composition and method. Additionally, the cleaning compositions of the present invention may clean built-up residue and scum from a substrate at lower temperatures then conventional cleaners. Accordingly, the cleaning composition and method of the present invention is more energy efficient.

The following Example is intended to further illustrate the present invention and are not intended to limit the scope of the invention.

EXAMPLE

Test Photoresist: The test photoresist used in the evaluations was composed of about 50% acrylic polymer, about 37% of acrylic monomers, about 10% of photoinitiators, and the remainder of the composition included dyes, stabilizers and flow control agents in conventional amounts.

Residue Testing in Developer Solution: 200 ml of an aqueous solution of 1 wt. % alkali carbonate was placed in a modified gas-washing bottle. Optionally, antifoam was put into the solution. 23 mil*ft$^2$/gal of uncured test photoresist was dissolved in this solution. The mixture was aerated with dry air at 1000 cc/min for 5 hrs. through a submerged glass frit. The solution temperature during aeration was 30° C. (86° F.). It was allowed to stand overnight at ambient temperature. The solution was then filtered through a 3 micron filter and the retained residue was dried and weighed.

TABLE 1

Amount of Residue Generated in a Photoresist-Loaded Developer Solution

|  | Recommended Antifoam Conc. (ppm) | Amount of Residue (mg) | Percent Residue Change |
| --- | --- | --- | --- |
| No Antifoam (control) | 0 | 28.4 | 0.0 |
| Commercial Antifoam A (polyalkylene oxide polyol) | 500 | 75.4 | +165.5 |
| Commercial Antifoam B (mineral oil) | 250 | >19.4* | X |
| Commercial Antifoam C (polysiloxane) | 125 | 29.5 | +3.9 |
| DOWFAX C10L/Byk-028 = 8/2 | 1775 | 21.2 | −25.3 | ppm = wt. antifoam in grams/vol. developer in milliliters

*Note:
For Commercial Antifoam B (mineral oil), the residue was very sticky and could not be easily removed from the test container. As a result the actual amount of the residue should be considerably higher.

Foam Testing in Developer Solution: 30 ml of aqueous solutions of 1 wt. % alkali carbonate was placed in a 250 mL graduated cylinder. Optionally, antifoam was put into the solution. 23 mil*ft$^2$/gal of uncured test photoresist was dissolved in this solution. The mixture was aerated with dry air at 1000 cc/min through a submerged glass frit. The foam height at 1, 2, 4, and 10 minutes was measured using the volume markings on the graduated cylinder. The experiment was carried out at ambient temperature. Less than or equal to 100 mL of foam was considered acceptable.

TABLE 2

Amount of Foam Generated in a Photoresist-Loaded Developer Solution

|  | Recommended Antifoam Conc. (ppm) | 1 min. | 2 min. | 4 min. | 10 min. | Avg. Percent Foam Change |
| --- | --- | --- | --- | --- | --- | --- |
| No Antifoam (control) | 0 | 166 | 171 | 166 | 163 | 0.0 |
| Commercial Antifoam A (polyalkylene oxide polyol) | 500 | 230 | 205 | 195 | 200 | +24.6 |
| Commercial Antifoam B (mineral oil) | 250 | 48 | 50 | 52 | 60 | −68.4 |
| Commercial Antifoam C (polysiloxane) | 125 | 88 | 92 | 97 | 112 | −41.6 |
| DOWFAX C 10 L/Byk-028 = 8/2 | 1775 | 74 | 78 | 78 | 82 | −53.2 | ppm = wt. antifoam in grams/vol. developer in milliliters

Foam Testing in Stripper Solution: 30 ml of aqueous solutions of 3 wt. % sodium hydroxide was placed in a 250 mL graduated cylinder. Optionally, antifoam was put into the solution. 23 Mil*ft$^2$/gal of cured test photoresist (65 mJ/cm$^2$, copper step 9 on a Stouffer 21 step wedge) was added to the solution and stirred for 2 hrs. at 54° C. (130° F.). The undissolved solids were filtered from the solution. The mixture was aerated with dry air at 1000 cc/min through a submerged glass frit. The foam height at 1, 2, 4, and 10 minutes was measured using the volume markings on the graduated cylinder. The experiment was carried out at 54° C. (130° F.). Less than or equal to 100 mL of foam was considered acceptable.

Percent Weight Change: to determine whether the part was swelling or dissolving (>5% considered a failure)

Visual and Tactile Examination: to determine whether the physical properties (e.g. appearance, hardness,

TABLE 3

Amount of Foam Generated in a Photoresist-Loaded Stripper Solution

| | Recommended Antifoam Conc. (ppm) | 1 min. | 2 min. | 4 min. | 10 min. | Avg. Percent Foam Change |
|---|---|---|---|---|---|---|
| No Antifoam (control) | 0 | 237 | 230 | 207 | 207 | 0.0 |
| Commercial Antifoam A (polyalkylene oxide polyol) | 500 | 125 | 130 | 136 | 124 | −41.5 |
| Commercial Antifoam B (mineral oil) | 250 | 71 | 77 | 95 | 104 | −60.6 |
| Commercial Antifoam C (polysiloxane) | 125 | 179 | 181 | 187 | 190 | −16.3 |
| DOWFAX C 10 L/Byk-028 = 8/2 | 1775 | 91 | 94 | 96 | 99 | −56.9 | ppm = wt. antifoam in grams/vol. stripper in milliliters

The DOWFAX C10L/Byk-028 mixture achieves the best overall properties in the developer and stripper as shown in Table 4.

elongation, etc.) of the part were changing compared to a control part that was not soaked

TABLE 4

Summary of Antifoam Properties in Photoresist-Loaded Developer and Stripper Solutions

| | Recommended Antifoam Conc. (ppm) | Percent Residue Change in Developer | Avg. Percent Foam Change in Developer | Avg. Percent Foam Change in Stripper |
|---|---|---|---|---|
| Commercial Antifoam A (polyalkylene oxide polyol) | 500 | +165.5 | +24.6 | −41.5 |
| Commercial Antifoam B (mineral oil) | 250 | Very sticky | −68.4 | −60.6 |
| Commercial Antifoam C (polysiloxane) | 125 | +3.9 | −41.6 | −16.3 |
| DOWFAX C 10L/Byk-028 = 8/2 | 1775 | −25.3 | −53.2 | −56.9 | ppm = wt. antifoam in grams/vol. developer or stripper in milliliters

Antifoam A did not perform well in the developer and stripper. Antifoam B worked well to control foam in the developer and stripper, but it resulted in very sticky residues in the developer. Antifoam C suppressed foam well in the developer, but it contributed to residues in the developer and only marginally lessened the foam in the stripper.

Equipment Parts Compatibility Testing: An aqueous solution of 1 wt. % alkali carbonate was placed in a container. Optionally, 2660 ppm of the novel antifoam (DOWFAX C10L/Byk-028=8/2 by weight) was put into the solution to exaggerate the presence of the antifoam in the system. 23 mil*ft$^2$/gal of uncured test resist was dissolved in this solution. Common materials used in the construction of photoresist processing equipment were soaked in this solution at 30° C. (86° F.) for 3 days.

Compatibility of the parts with the cleaning composition was determined via the following tests:

TABLE 5

Percent Weight Change After Soaking

| | % Weight Change with No Additive (control) | % Weight Change with DOWFAX C10L/Byk-028 = 8/2 |
|---|---|---|
| Polyvinylchloride | 0 | 0 |
| Polyethylene | 0 | 0 |
| Polypropylene | 0 | 0 |
| Teflon | 0 | 0 |
| Tygon | +0.1 | +0.1 |
| Silicone Rubber | +0.3 | +0.4 |
| Nitrile Rubber | +1.3 | −1.0 |
| Buna-N Rubber | +1.1 | +1.4 |
| Viton | +0.7 | +0.8 |
| EPDM Rubber | 0 | 0 |
| Neoprene Rubber (30A) | +0.7 | +1.2 |
| Neoprene Rubber (80A) | +0.3 | +0.7 |
| Precision Brass | 0, blackened | 0, blackened |
| Extruded Brass | 0, blackened | 0, blackened |

TABLE 5-continued

Percent Weight Change After Soaking

| | % Weight Change with No Additive (control) | % Weight Change with DOWFAX C10L/Byk-028 = 8/2 |
|---|---|---|
| Cast Brass | 0, blackened | 0, blackened |
| 304 Stainless Steel | 0 | 0 |
| 316 Stainless Steel | 0 | 0 |
| Titanium | 0 | 0 |

Visual and Tactile Examination: Other than the swelling (see weight change measurements), there were no other obvious changes observed from visual and tactile examinations of the parts with the exception of the brass parts in which the control and the experimental sample both showed blackening of the parts.

In summary, the main advantages of the residue-reducing antifoam were:
- Effective control of foam in the developer and stripper
- Minimization of residue formation in the developer
- Compatibility with common equipment parts.

What is claimed is:

1. A composition consisting of a photolithographic residue reducing-antifoaxn component consisting essentially of about 20% by weight to about 95% by weight of a diphenyl oxide with at least one hydrophobic group in combination with an antifoam agent in an amount of about 5% by weight to about 80% by weight of the component; and a developer or stripper.

2. A composition consisting of a photolithographic residue reducing-antifoam component and a developer or stripper, the photolithographic residue reducing-antifoam component consists essentially of a diphenyl oxide with at least one hydrophobic group in an amount of about 50% by weight to about 85% by weight of the residue reducing anti-foam component in combination with an antifoam agent; an auxiliary surfactant; and a solvent.

3. The composition of claim 2 wherein the diphenyl oxide with at least one hydrophobic group has the formula:

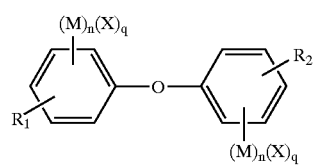

(I)

where M is $-COO^-$, $-SO_3^-$, $-SO_4^{2-}$, $-PO_4^{3-}$, $-PO_4(R')_2$, X is hydrogen or a counter ion, $R_1$ and $R_2$ are the same or different and are hydrogen, cycloaliphatic, or an aromatic group, R' is a hydrocarbon, n and q are 0 or 1 with the proviso that at least one of the two phenyl rings has n=1.

4. The composition of claim 3, wherein $R_1$ and $R_2$ are a $C_1$ to $C_{25}$ linear or branched aliphatic group, as $C_5$ to $C_{10}$ cycloaliphatic group, or a $C_5$ to $C_{14}$ aromatic group.

5. The composition of claim 2, wherein M is $-SO_3^-$, $-PO_4^{3-}$, $-PO_4(R')_3$, wherein R' is hydrogen or a $C_1$ to $C_{20}$ aliphatic group.

6. The composition of claim 2, wherein the antifoam agent comprises silicones, hydrocarbons, acetylenics, vinyl polymers, polyalkoxylates, or mixtures thereof.

7. The composition of claim 6, wherein the silicon is a polysiloxane.

8. The composition of claim 6, wherein the hydrocarbons have formula:

$$C_mH_{2m+2}$$

wherein m is from 10 to 18.

9. The composition of claim 6, wherein the acetylenics are compounds of formula:

$$R_5-C\equiv C-R_6$$

wherein $R_5$ and $R_6$ are the same or different and are linear or branched alkyl or aryl.

10. The composition of claim 6, wherein the polyalkoxylate is a compound of formula:

$$R_7-(PO)_x-(EO)_y-(PO)_z-H$$

wherein $R_7$ is a linear, alkyl hydrocarbon with an average of from 7 to 10 carbon atoms; PO is a propylene oxide group of formula:

$$(CH_2-CH-O)$$
$$\quad\quad\quad |$$
$$\quad\quad\; CH_3$$

and EO is an ethylene oxide group ($CH_2-CH_2-O$), x is an integer of from 1 to 6, y is an integer of from 4 to 15 and z is an integer of from 4 to 25.

11. The composition of claim 2, wherein the developer or stripper component comprises a carbonate, bicarbonate, potassium hydroxide, sodium hydroxide, ammonium hydroxide, or mixtures thereof.

* * * * *